(12) United States Patent
Tang

(10) Patent No.: US 6,476,671 B1
(45) Date of Patent: Nov. 5, 2002

(54) PING-PONG AMPLIFIER WITH AUTO-ZEROING AND CHOPPING

(75) Inventor: Andrew T. K. Tang, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/946,747

(22) Filed: Sep. 4, 2001

(51) Int. Cl.[7] .............................. H03F 1/02; H03K 17/00
(52) U.S. Cl. .............................. 330/9; 330/51; 327/124
(58) Field of Search ........................... 330/9, 51, 69, 330/358; 327/124, 307

(56) References Cited

U.S. PATENT DOCUMENTS

| | | | | |
|---|---|---|---|---|
| 4,931,745 A | | 6/1990 | Goff et al. ....................... | 330/9 |
| 5,115,202 A | | 5/1992 | Brown ............................ | 330/9 |
| 6,121,831 A | * | 9/2000 | Mack ............................. | 330/9 |
| 6,140,872 A | * | 10/2000 | McEldowney ................. | 330/9 |
| 6,407,630 B1 | * | 6/2002 | Yao et al. ....................... | 330/9 |

OTHER PUBLICATIONS

IEEE Journal of Solid–State Circuits, A Rail–to–Rail Ping-–Pong Op–Amp, Ion E. Opris and Gregory T.A. Kovacs, vol. 31, No. 9, Sep. 1996, pp. 1320–1324.

Electronics, Chopper–Stabilized Op Amp Combines MOS and Bipolar Elements on One Chip, Sep. 27, 1973, pp. 209–213.

IEEE Journal of Solid–State Circuits, A Low–Noise Chopper–Stabilized Differential Switched–Capacitor Filtering Technique, vol. SC–16, No. 6, Dec. 1981, pp. 708–715.

IEE Journal of Solid–State Circuits, A Low Drift Fully Integrated MOSFET Operational Amplifier, vol. Sc–13, No. 4, Aug. 1978, pp. 499–503.

* cited by examiner

*Primary Examiner*—Robert Pascal
*Assistant Examiner*—Khanh Van Nguyen
(74) *Attorney, Agent, or Firm*—Koppel, Jacobs, Patrick & Heybl

(57) ABSTRACT

A ping-pong amplifier employs auto-zeroing and chopping to simultaneously achieve low offset voltage and low frequency noise, as well as low energy at the chopping frequency. The ping-pong amplifier includes respective nulling amplifiers for each of its gain amplifiers, which auto-zero each gain amplifier. In addition, switches are included which allow the inputs and outputs of the active gain amplifier to be chopped. Thus, while one gain amplifier is being auto-zeroed, the other gain amplifier amplifies the input signal and its inputs and outputs are chopped. One of the described embodiments includes circuitry which reduces switching transients that might otherwise appear in the amplifier's output by ensuring that the common-mode output voltage of each gain amplifier is kept equal to a common-mode reference voltage.

16 Claims, 17 Drawing Sheets

US 6,476,671 B1

PING-PONG AMPLIFIER WITH AUTO-ZEROING AND CHOPPING

BACKGROUND OF THE INVENTION

1. Field of the Invention

This invention relates to the field of ping-pong amplifiers, and particularly to techniques for reducing low frequency noise and offset voltage errors for such amplifiers.

2. Description of the Related Art

Ping-pong amplifiers are well known and widely used due to their low input offset voltages. A schematic diagram of a basic ping-pong amplifier 10 is shown in FIG. 1. Two gain amplifiers A1 and A2, each of which has differential inputs and outputs, receive a differential input signal made up of signals INP and INN. The ping-pong amplifier also typically includes an output amplifier A0, which is connectable to the outputs of A1 via a pair of switches S1 and S2, or to the outputs of A2 via a pair of switches S3 and S4.

A pair of fully differential nulling amplifiers A3 and A4 are used to auto-zero A1 and A2, respectively; the inputs of A3 and A4 are connected to the outputs of A1 and A2 via pairs of switches S5/S6, and S7/S8. A pair of memory capacitors C1 and C2 are connected to the inputs of A3, and capacitors C3 and C4 are connected to A4's inputs. A switch S9 is connected between the inputs of A1, and a switch S10 is connected between the inputs of A2. A switch S11 is connected between the differential input signal and one of A1's inputs, and a switch S12 is connected between the differential input signal and one of A2's inputs.

The switches are controlled with a control circuit (not shown), which operates them in accordance with the timing diagram shown in FIG. 1a. The ping-pong amplifier has a two-phase timing cycle. During the first phase ($\phi 1$), switches S5, S6 and S9 are closed, such that amplifier A1 is auto-zeroed by the output currents of nulling amplifier A3, with the error signals stored on memory capacitors C1 and C2. Switches S3, S4 and S12 are also closed, allowing the differential input signal to be amplified by A2 followed by A0. The roles are reversed during the second phase ($\phi 2$): switches S7, S8 and S10 are closed such that A2 is auto-zeroed by A4 (with the error signals stored on memory capacitors C3 and C4), and switches S1, S2 and S11 are closed such that the input signal is amplified by A1 followed by A0.

Auto-zeroing is effective in reducing offset voltage and 1/f noise. However, the technique suffers from aliasing of wideband noise into the frequency range between DC and the auto-zeroing frequency. Because of this, the low frequency noise spectral density of a conventional auto-zeroed amplifier is several times higher than the thermal noise of a conventional CMOS op amp.

Some amplifiers seek to reduce offset voltage and 1/f noise by "chopping" the input and output of the amplifier; i.e., modulating a low frequency input signal up to near a chopping frequency, where it is amplified and modulated back down to the original frequency. This technique does not suffer from wideband noise aliasing. However, chopping also modulates the offset voltage up to the chopping frequency, resulting in a large energy at the chopping frequency. This energy limits the usable bandwidth, and often requires filtering.

SUMMARY OF THE INVENTION

A ping-pong amplifier and method are presented which overcome the problems noted above. The invention employs auto-zeroing and chopping to simultaneously achieve low offset voltage and low low frequency noise, as well as low energy at the chopping frequency.

The novel ping-pong amplifier includes respective nulling amplifiers for each of its gain amplifiers, which auto-zero each gain amplifier. In addition, switches are included which allow the differential inputs and outputs of the gain amplifiers to be chopped. Thus, while one gain amplifier is being auto-zeroed, the other gain amplifier amplifies the input signal while its inputs and outputs are chopped.

One of the described embodiments includes circuitry which reduces switching transients that might otherwise appear in the amplifier's output. Here, each of gain amplifiers A1 and A2 includes a common-mode reference voltage input CMR connected to receive a common-mode reference voltage VCMR, and a common-mode feedback circuit; VCMR is typically set to a value between the amplifier's power rails so that the amplifier may have a high gain. The common-mode feedback circuit sets the amplifier's common-mode output voltage —given by the sum of its differential outputs divided by 2—so that each of its outputs is nominally set to VCMR when the differential output voltage is zero. The ping-pong amplifier includes an error amplifier, which has one input connected to common-mode reference voltage VCMR, its other input switchably connected to the common-mode output of one of the two gain amplifiers A1 and A2, and an output which is switchably connected to the CMR inputs of A1 and A2. Respective memory capacitors are connected to the two CMR inputs. In operation, the error amplifier's input is periodically connected to the common-mode output of A1, and its output is connected to A1's CMR input. This arrangement forms a closed-loop which forces A1's common-mode output voltage (referred to herein as "VCMR1") to be equal to VCMR; the error amplifier's output voltage is stored on the memory capacitor connected to A1's CMR input. Similarly, the error amplifier's input and output are periodically connected to A2's common-mode output and CMR input, respectively, to force A2's common-mode output voltage (referred to herein as "VCMR2") to be equal to VCMR, with the error amplifier's output voltage stored on the memory capacitor connected to the A2's CMR input. The voltages stored on the memory capacitors continuously adjust the common-mode output voltages so that VCMR1 and VCMR2 are held equal to VCMR. Keeping VCMR1=VCMR2=VCMR ensures that transients due to mismatch in the common-mode feedback circuit are largely reduced.

Further features and advantages of the invention will be apparent to those skilled in the art from the following detailed description, taken together with the accompanying drawings.

BRIEF DESCRIPTION OF THE DRAWINGS

FIG. 2b is a timing diagram illustrating the operation of the ping-pong amplifier of FIG. 2a.

FIGS. 4a–4e are other possible timing diagrams for the ping-pong amplifier of FIG. 2a.

FIGS. 5b–5e are possible timing diagrams for the ping-pong amplifier of FIG. 5a.

DETAILED DESCRIPTION OF THE INVENTION

Figure 1:
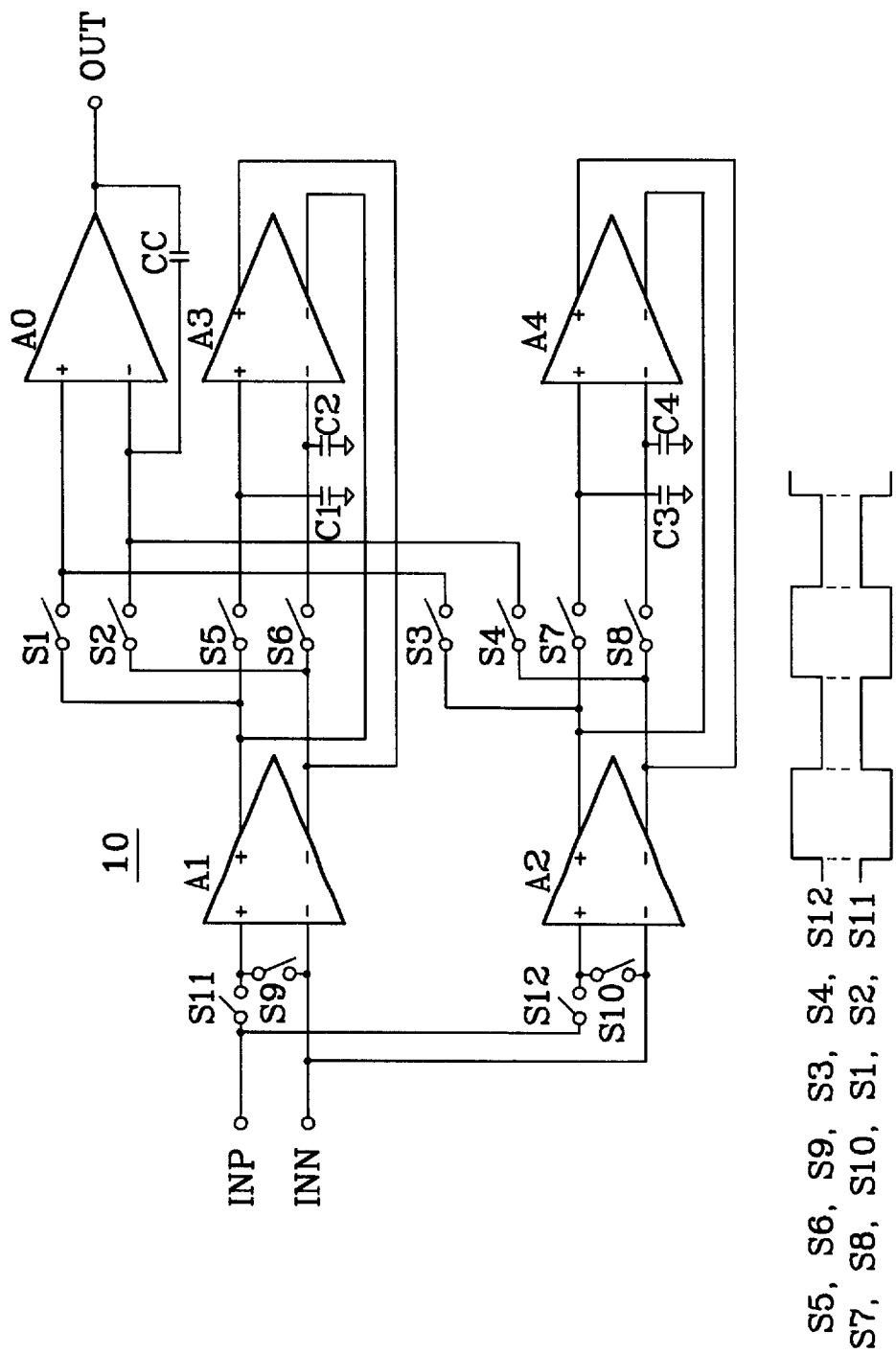
FIG. 1 is a schematic diagram and timing diagram for a prior art ping-pong amplifier.
Figure 2A:
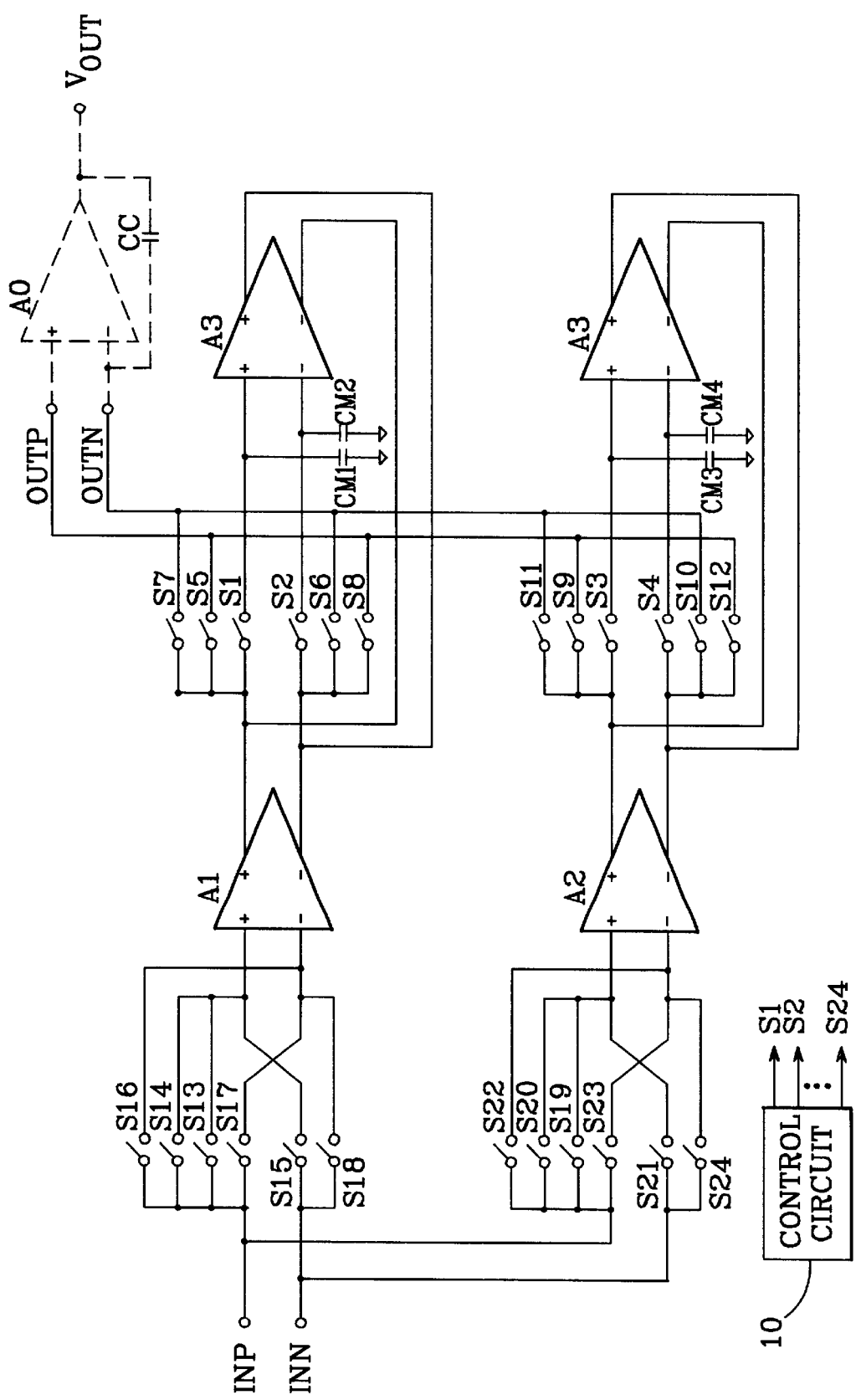
FIG. 2a is a schematic diagram of a ping-pong amplifier in accordance with the present invention.

A schematic diagram of a ping-pong amplifier which illustrates the principles of the invention is shown in FIG. 2a. The ping-pong amplifier receives a differential input signal comprising positive and negative lines INP and INN. A pair of fully differential gain amplifiers A1 and A2 each receive the differential input signal via an array of switches (discussed below). The differential outputs of A1 are connected to a fully differential nulling amplifier A3 via a pair of switches S1 and S2, and the outputs of A2 are connected to a fully differential nulling amplifier A4 via a pair of switches S3 and S4. A pair of memory capacitors CM1 and CM2 are connected to A3's non-inverting and inverting inputs, respectively, and A3's non-inverting and inverting outputs are connected to the inverting and non-inverting outputs of A1, respectively. Similarly, a pair of memory capacitors CM3 and CM4 are connected to A4's non-inverting and inverting inputs, respectively, and A4's non-inverting and inverting outputs are connected to the inverting and non-inverting outputs of A2, respectively.

The ping-pong amplifier produces a differential output signal comprising positive and negative lines OUTP and OUTN. A1's non-inverting and inverting outputs can be connected to OUTP and OUTN, respectively, via a pair of switches S5 and S6, and can be connected to OUTN and OUTP, respectively, via a pair of switches S7 and S8. Similarly, A2's non-inverting and inverting outputs can be connected to OUTP and OUTN, respectively, via a pair of switches S9 and S10, and can be connected to OUTN and OUTP, respectively, via a pair of switches S11 and S12.

The non-inverting input of A1 can be connected to INP via switches S13 or S14, or to INN via a switch S15. A1's inverting input can be connected to INP via switches S16 or S17, or to INN via a switch S18. Similarly, the non-inverting input of A2 can be connected to INP via switches S19 or S20, or to INN via a switch S21. A2's inverting input can be connected to INP via switches S22 or S23, or to INN via a switch S24.

The ping-pong amplifier also preferably includes an output amplifier A0, which has a single-ended output OUT and differential inputs connected to OUTP and OUTN. A compensation capacitor CC is preferably connected between A0's output OUT and its inverting input.

The circuit configuration described above enables the ping-pong amplifier to employ both auto-zeroing and chopping techniques to improve performance. Switches S1–S24 form a switching network, which is controlled by means of a control circuit 10. Operation of the exemplary ping-pong amplifier of FIG. 2a is illustrated in the timing diagram of FIG. 2b. A four-phase timing cycle is used. Amplifier A1 is auto-zeroed during the first and second phases ($\phi 1$ and $\phi 2$): switches S14 and S16 are closed to connect A1's inputs together, and switches S1 and S2 are closed to connect A1's outputs to the inputs of nulling amplifier A3. The resulting error signals are stored on memory capacitors CM1 and CM2, and thereby applied to the inputs of nulling amplifier A3. A3 converts the stored voltages to a pair of currents, which serve to auto-zero A1's outputs.

Note that, though amplifier A1 is described above as being auto-zeroed during $\phi 1$ and $\phi 2$, it may also be auto-zeroed during ($\phi 1$ only or during $\phi 2$ only. Each of these alternatives is functionally equivalent to auto-zeroing A1 during $\phi 1$ and $\phi 2$.

During $\phi 1$, switches S9, S10, S19 and S24 are closed, connecting the non-inverting and inverting outputs of A2 to OUTP and OUTN, respectively, and A2's non-inverting and inverting inputs to INP and INN, respectively, such that differential input signals INP and INN are amplified by A2 followed by output amplifier A0.

During $\phi 2$, the input and output connections to A2 are reversed: S9, S10, S19 and S24 are opened, and switches S11, S12, S21 and S23 are closed, thereby connecting the non-inverting and inverting outputs of A2 to OUTN and OUTP, respectively, and A2's non-inverting and inverting inputs to INN and INP, respectively. This has the effect of chopping the input and output signals of A2, which continues to amplify the input signal throughout $\phi 2$.

The roles of A1 and A2 are reversed during $\phi 3$ and $\phi 4$. Switches S3, S4, S20 and S22 are closed during $\phi 3$ and $\phi 4$ to auto-zero A2, with the resulting error voltages stored on memory capacitors CM3 and CM4 such that auto-zeroing signals are continuously applied to A2's outputs.

As discussed above in relation to the auto-zeroing of A1, A2 may be auto-zeroed during $\phi 3$ only or during $\phi 4$ only. Each of these alternatives is functionally equivalent to auto-zeroing A2 during $\phi 3$ and $\phi 4$.

During $\phi 3$, switches S5, S6, S13 and S18 are closed, connecting the non-inverting and inverting outputs of A1 to OUTP and OUTN, respectively, and A1's non-inverting and inverting inputs to INP and INN, respectively, such that differential input signals INP and INN are amplified by A1 followed by output amplifier A0.

During $\phi 4$, the input and output connections to A1 are reversed: S5, S6, S13 and S18 are opened, and switches S7, S8, S15 and S17 are closed, thereby connecting the non-inverting and inverting outputs of A1 to OUTN and OUTP, respectively, and A1's non-inverting and inverting inputs to INN and INP, respectively. This has the effect of chopping the input and output signals of A1, which continues to amplify the input signal throughout $\phi 4$.

Figure 2B:
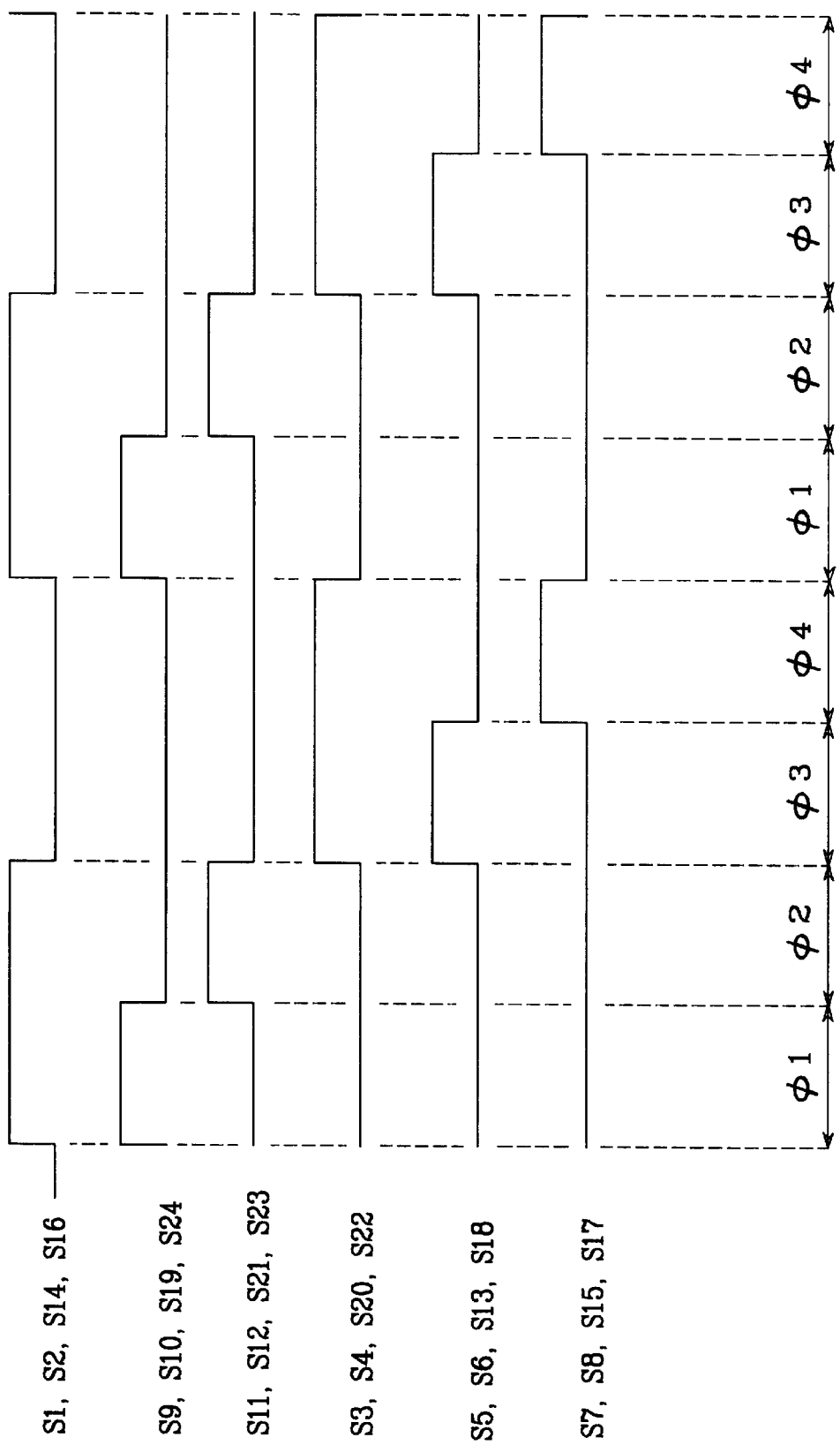
Figure 3A:
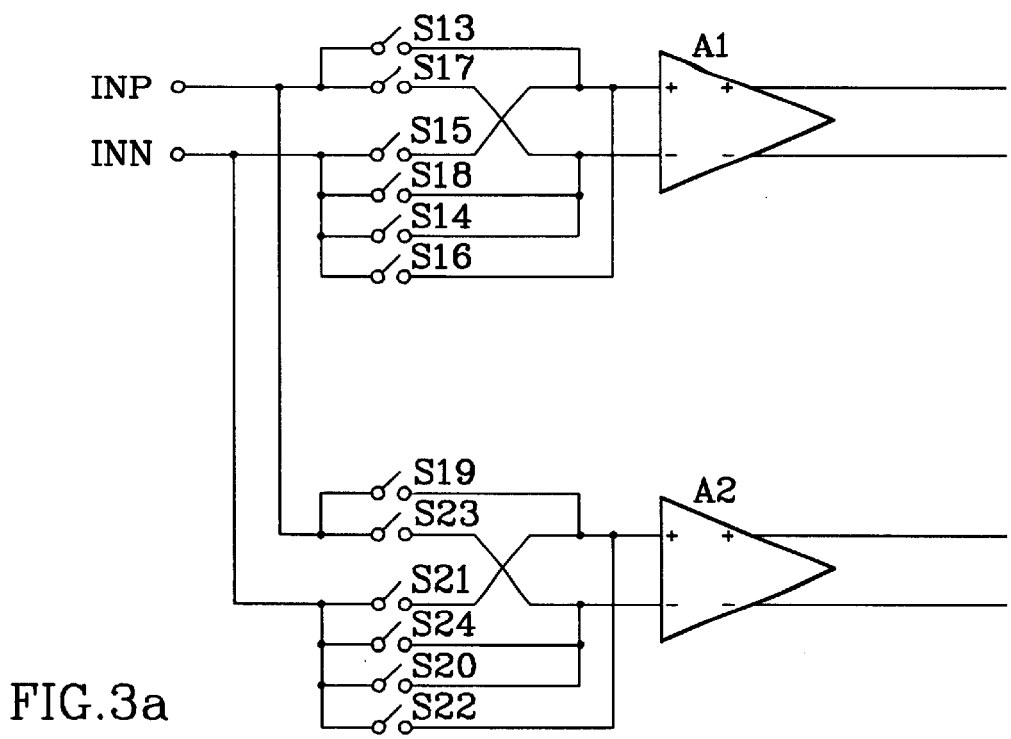
FIGS. 3a–3g are other possible input switch arrangements for a ping-pong amplifier in accordance with the present invention.
Figure 3B:
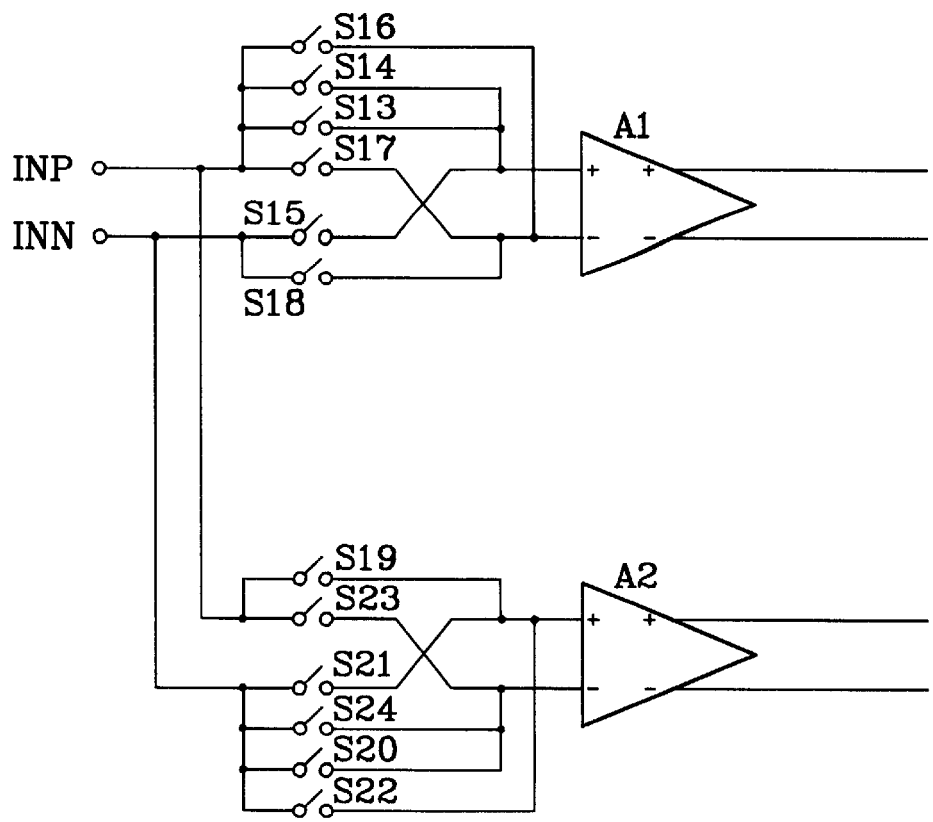
Figure 3C:
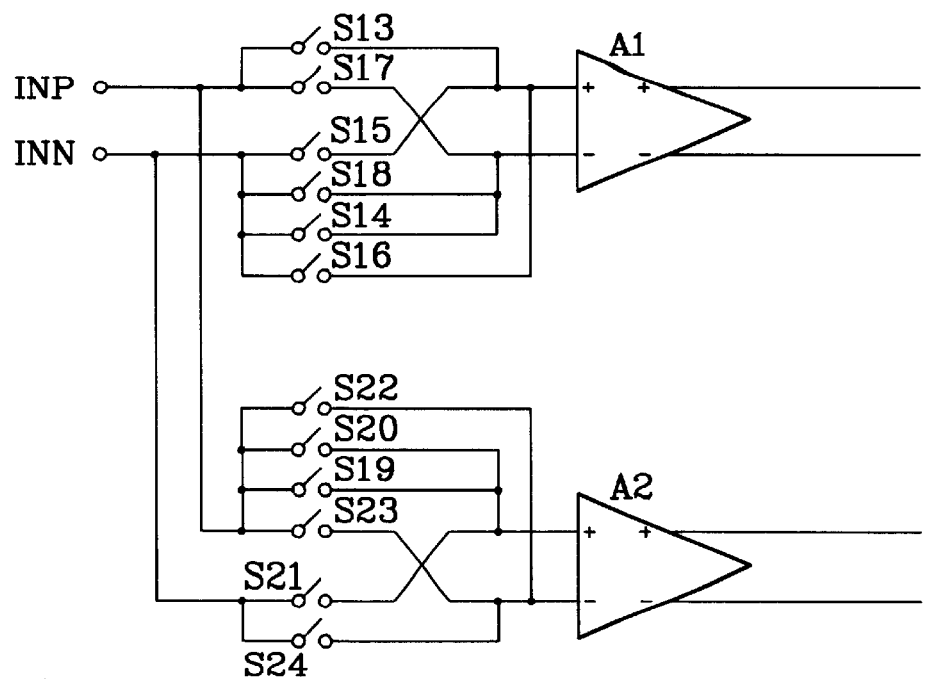
Figure 3D:
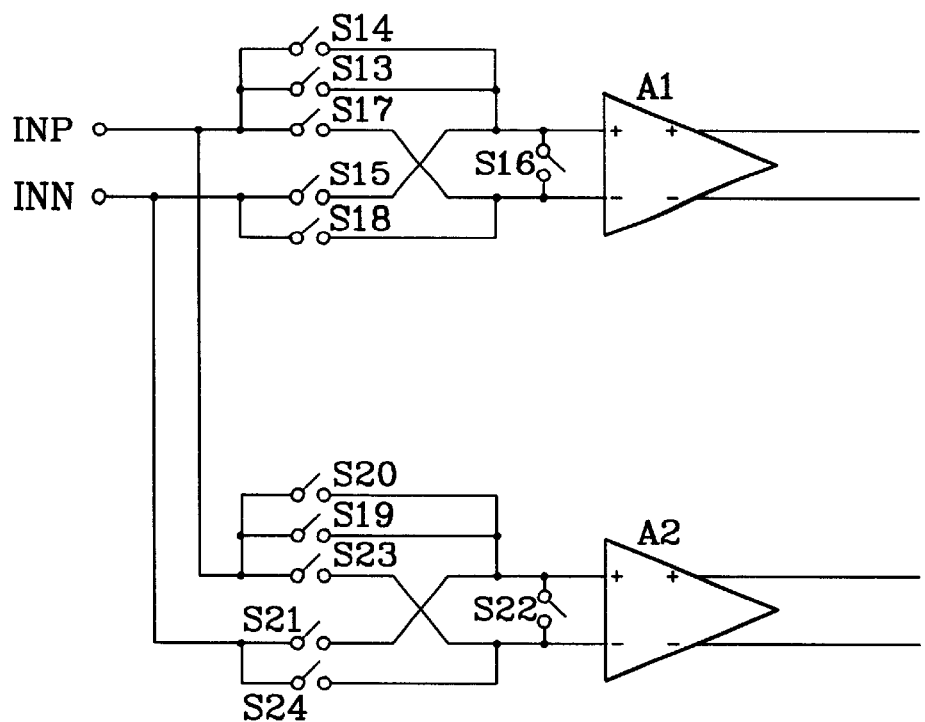
Figure 3E:
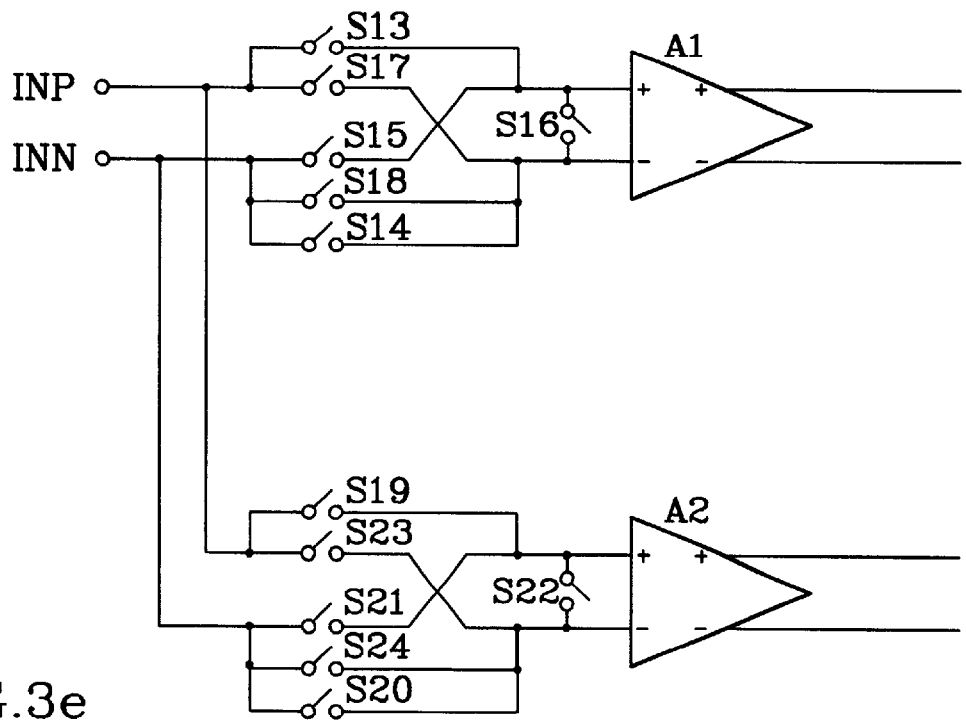
Figure 3F:
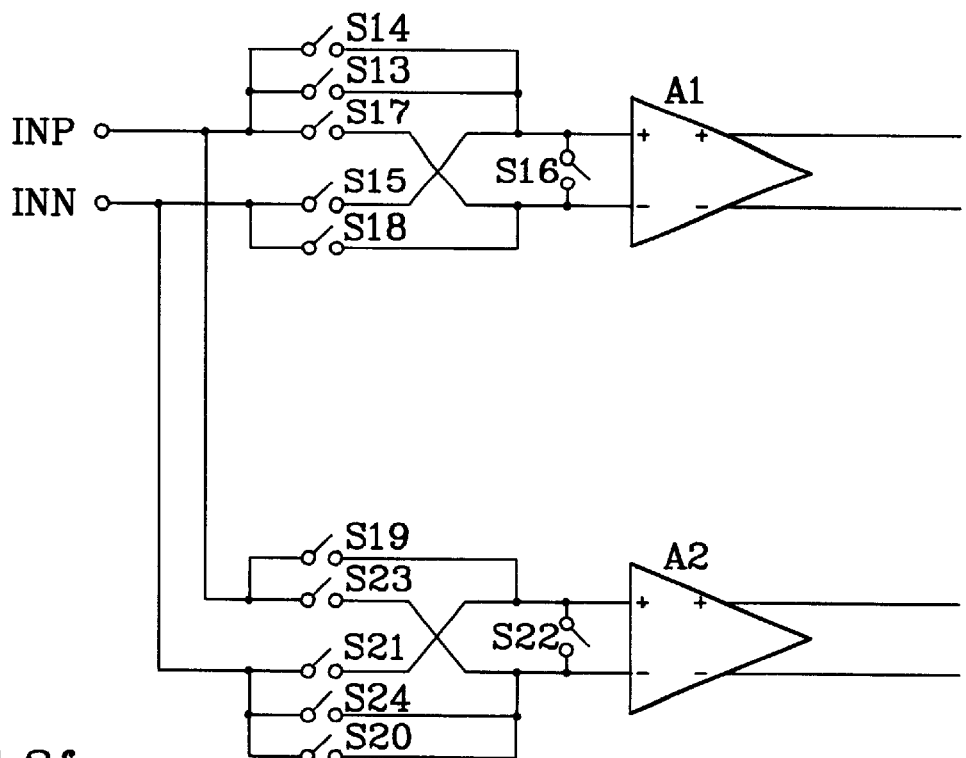
Figure 3G:
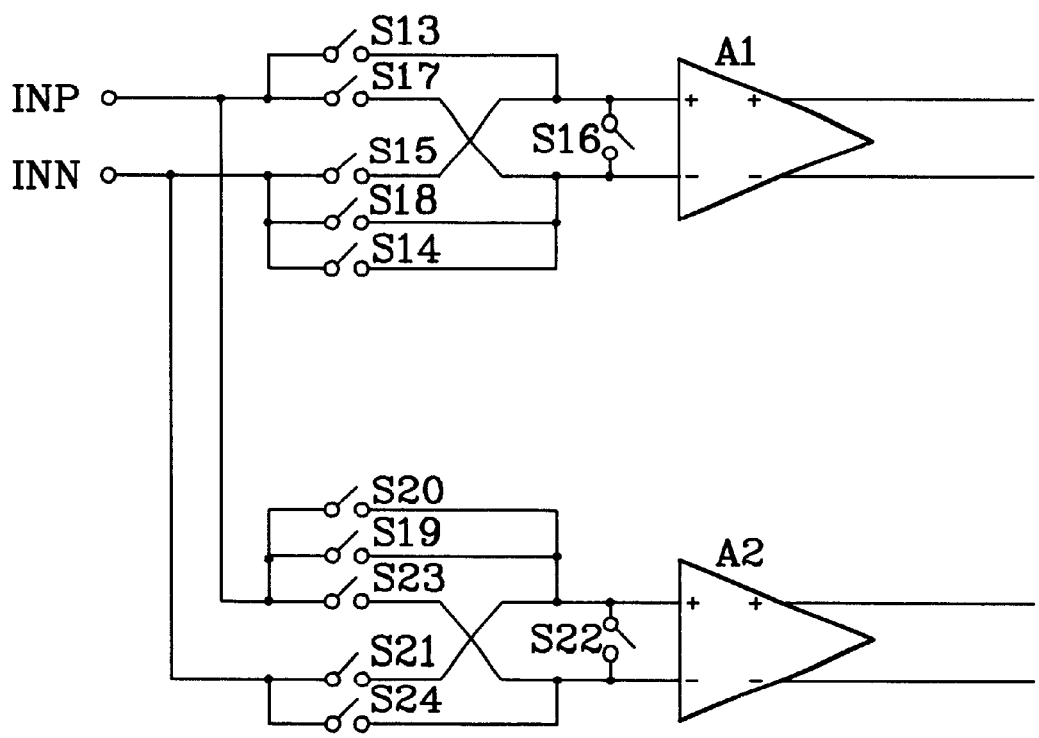

Other possible arrangements of input switches S13–S24 are shown in FIGS. 3a–3g. Each of these input switch arrangements is functionally equivalent to that shown in FIG. 2a, and will provide equivalent performance. The timing diagram shown in FIG. 2b is valid for all of the depicted input switch arrangements.

Figure 4A:
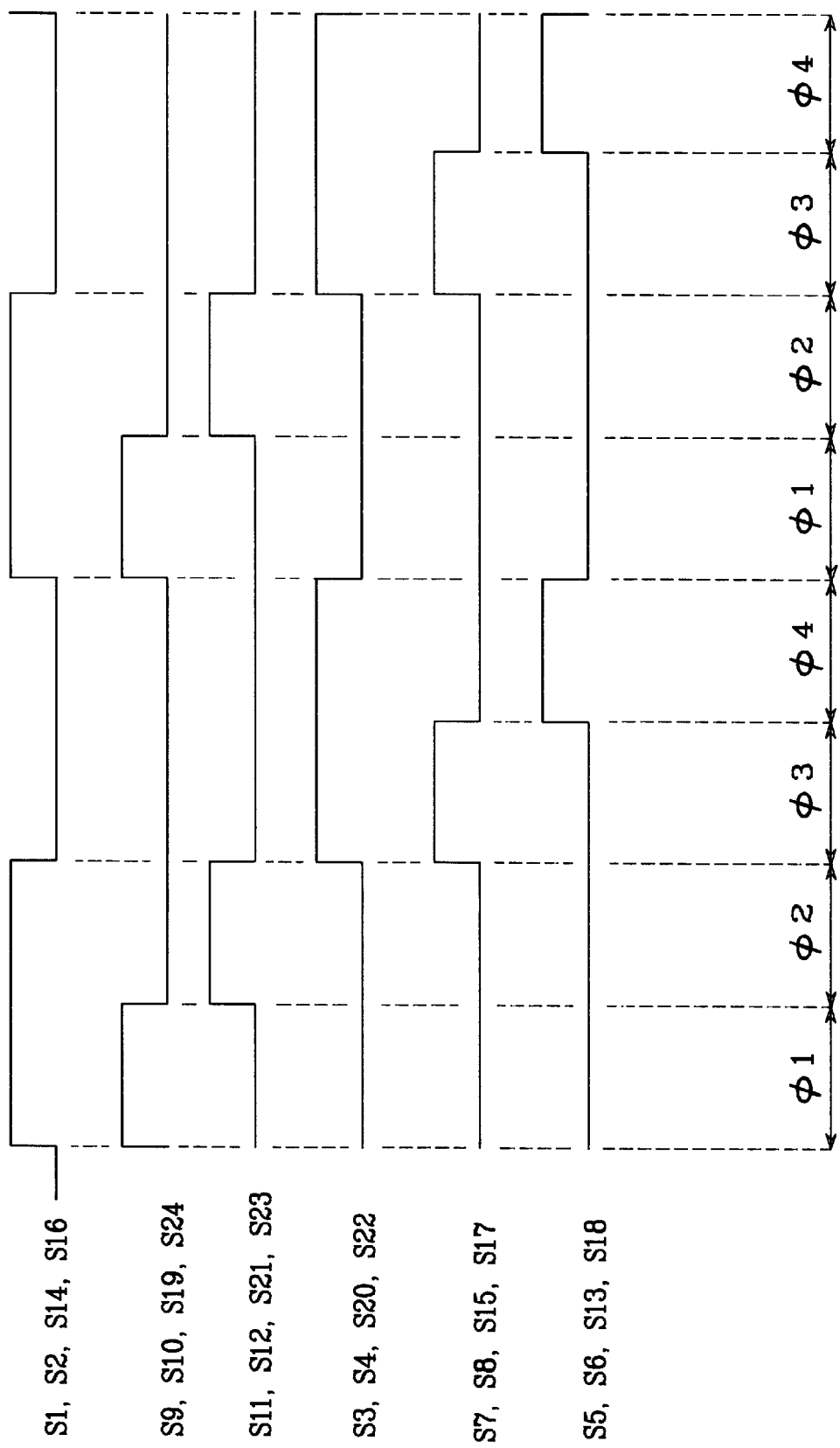
Figure 4B:
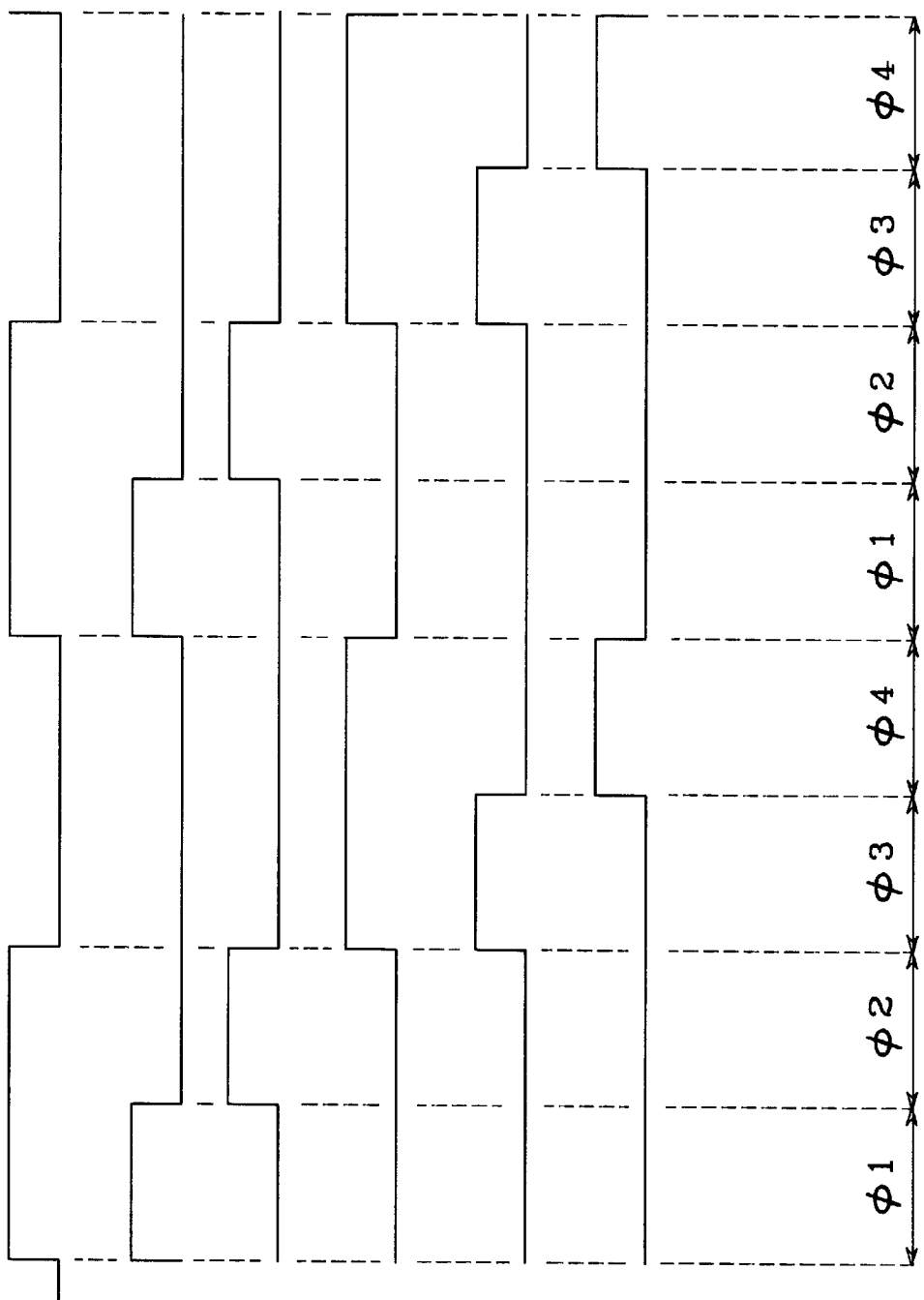
Figure 4C:
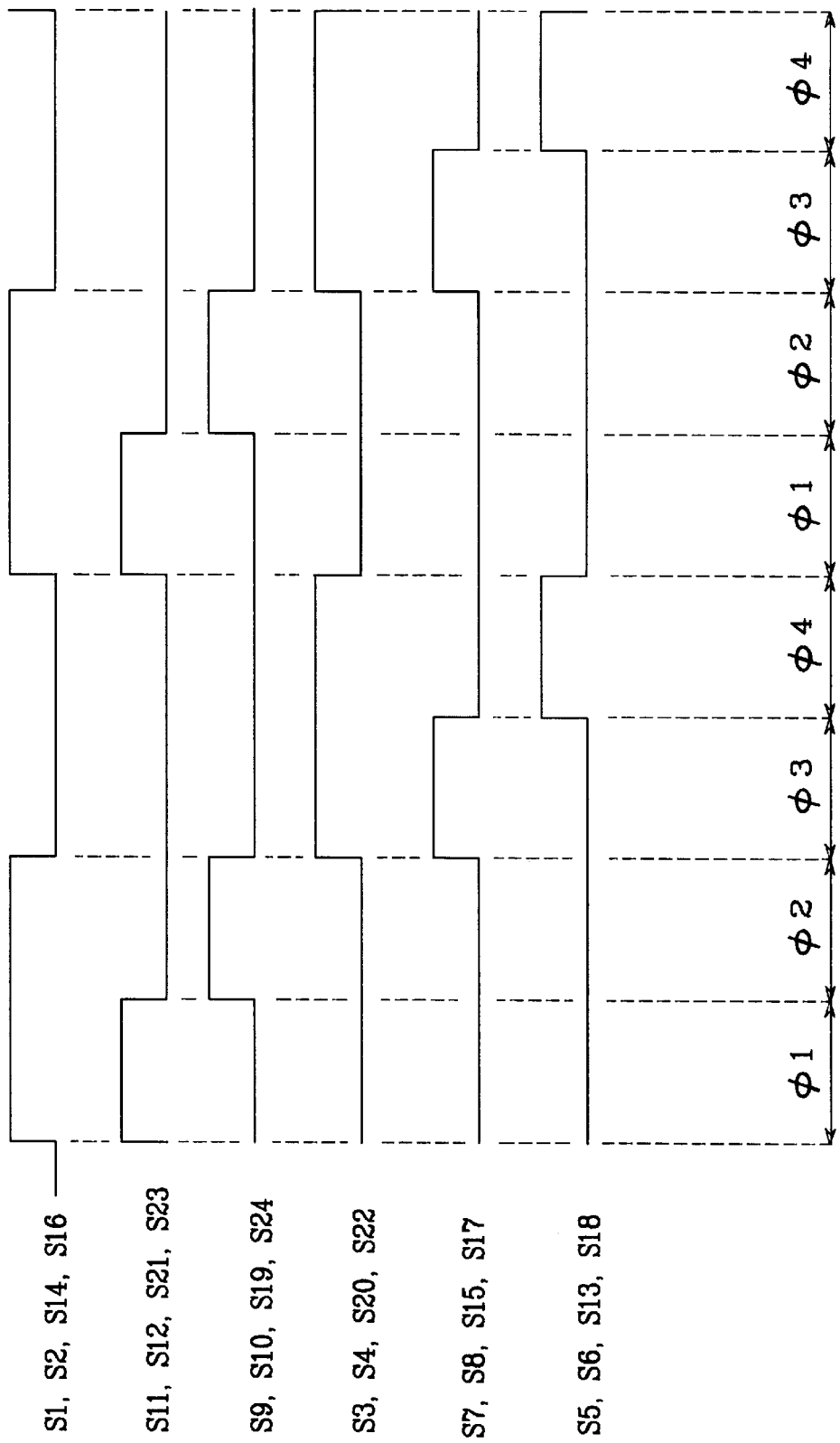

Other possible timing diagrams are shown in FIGS. 4a–4d. Each of these timing diagrams is functionally equivalent to that shown in FIG. 2b, and is valid for the switch arrangements shown in FIG. 2a and FIGS. 3a–3g. In FIG. 4a, the chopping sequence performed while A1 amplifies the input signal is reversed (when compared with FIG. 2b), while in FIG. 4b, the chopping sequence performed while A2 amplifies the input signal is reversed. In FIG. 4c, both chopping sequences are reversed.

Figure 4D:
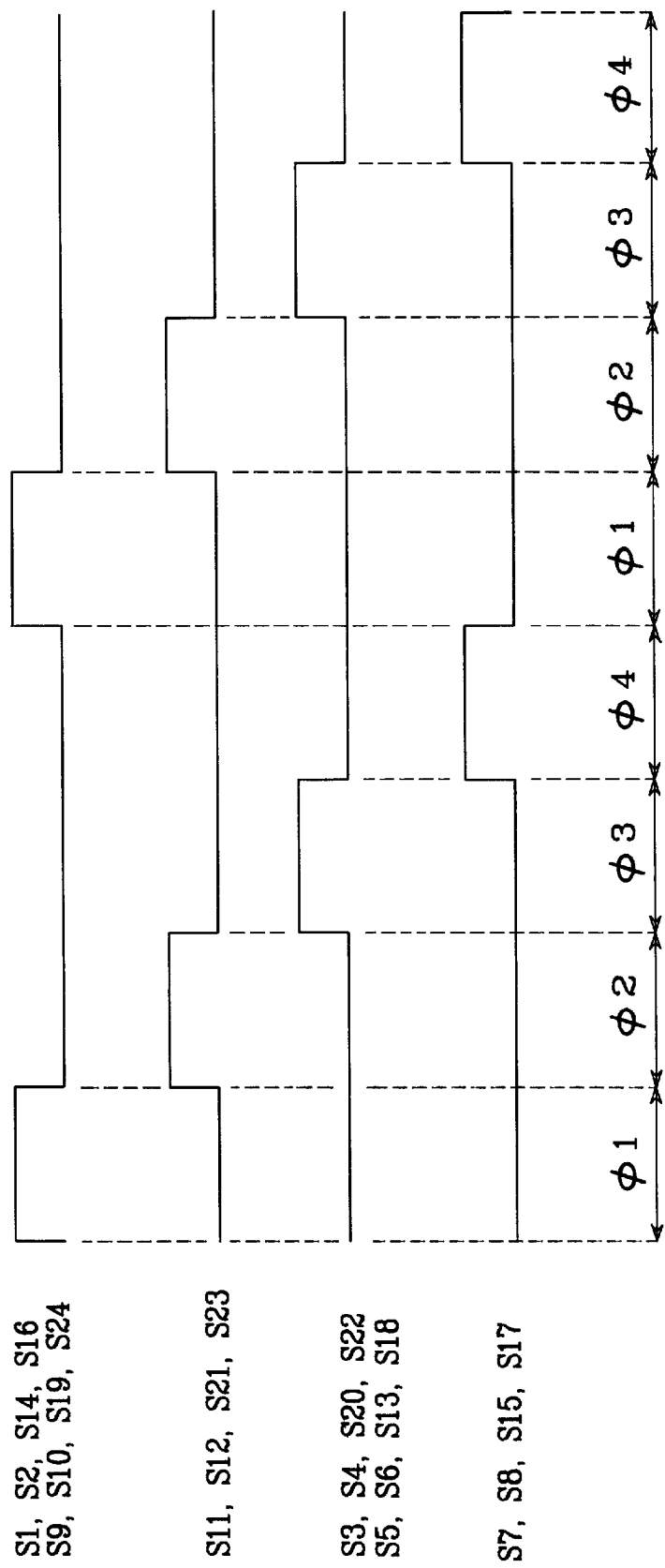

The timing diagram shown in FIG. 4d is intended to illustrate the auto-zeroing of one of the gain amplifier during just one phase of the timing cycle. In the example shown, amplifier A1 is auto-zeroed only during $\phi 1$, and amplifier A2 is auto-zeroed only during $\phi 3$.

Figure 4E:
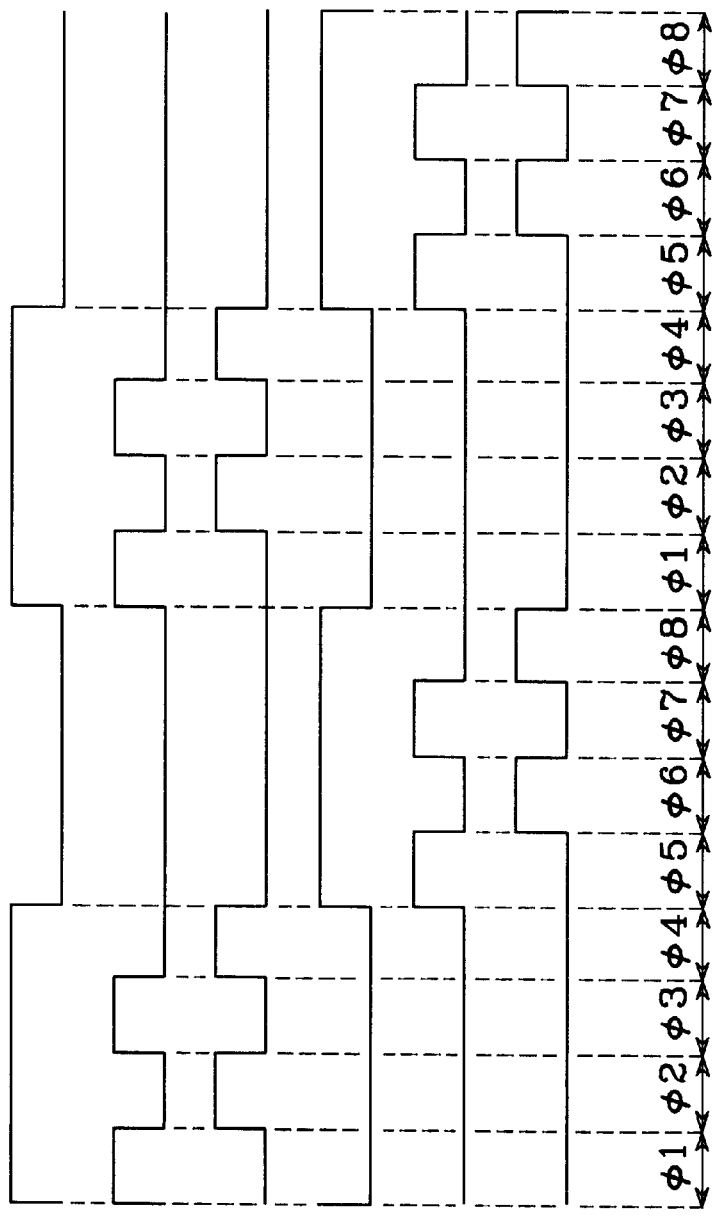

Another possible timing diagram is shown in FIG. 4e. Here, rather than perform a single chopping cycle during each auto-zero period, as in FIG. 2b and FIGS. 4a–4d, multiple chopping cycles are performed during each auto-zero period. This timing arrangement is functionally similar to that described above, and provides the same low offset and low low frequency noise benefits. Two chopping cycles per auto-zero period are illustrated in FIG. 4e; this would require the control circuit to operate the switching network in accordance with an 8-phase timing cycle.

Figure 5A:
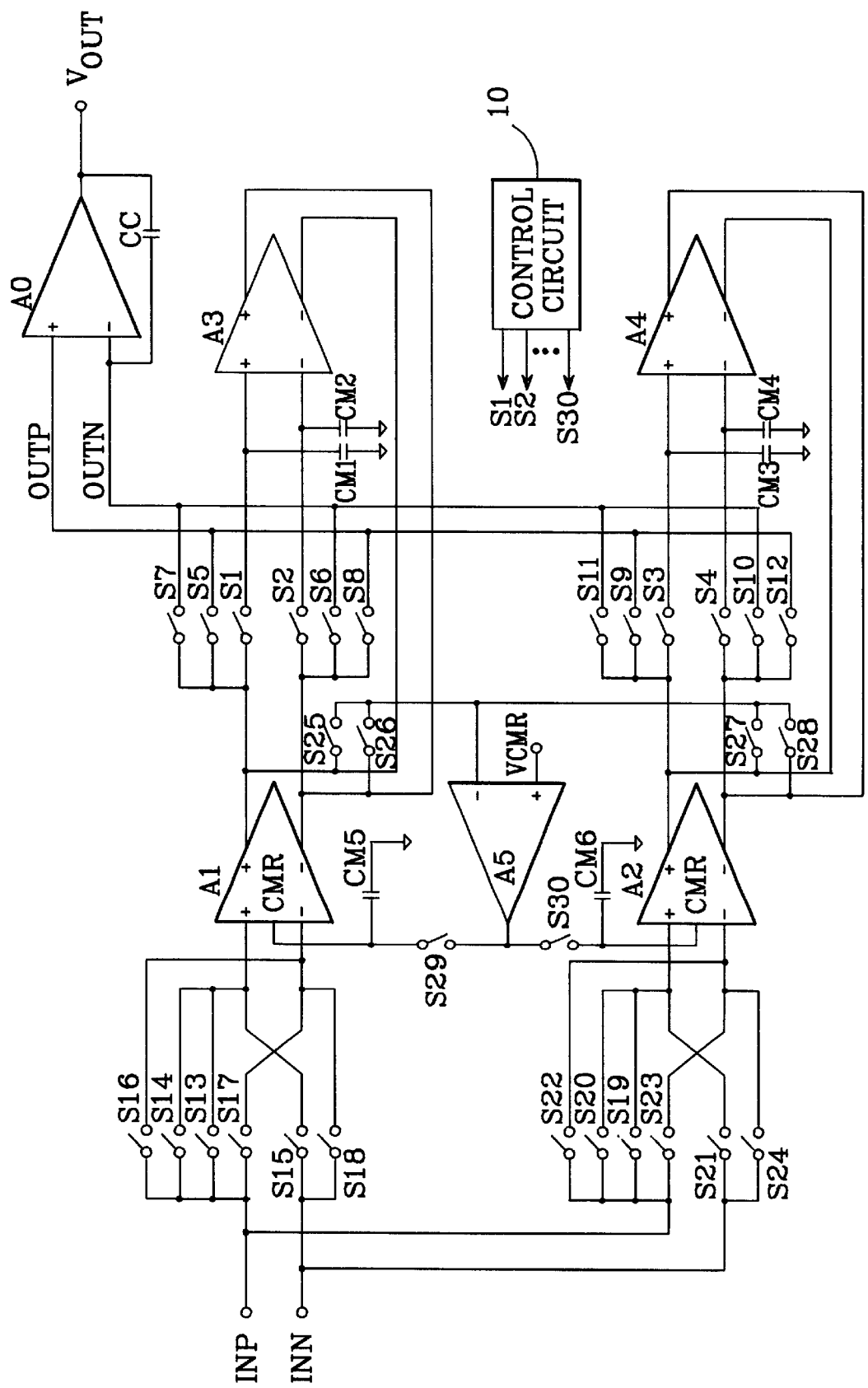
FIG. 5a is a schematic diagram of an embodiment of a ping-pong amplifier in accordance with the present invention which includes circuitry that reduces switching transients.

An embodiment of the present invention which includes circuitry that reduces switching transients which might otherwise appear in the amplifier's output is shown in FIG. 5a. Here, each of the fully differential gain amplifiers A1 and A2 includes a common-mode reference voltage input CMR connected to receive a common-mode reference voltage VCMR, and a common-mode feedback circuit; VCMR is typically set to a value between the amplifier's power rails so that the amplifier may have a high gain. The common-mode feedback circuit sets the amplifier's common-mode output voltage so that each of its outputs is nominally set to VCMR when the differential output voltage is zero.

This embodiment of the present ping-pong amplifier also includes an error amplifier A5, which has one input connected to common-mode reference voltage VCMR, and its other input switchably connected to the common-mode output of one of the two gain amplifiers A1 and A2. A pair of switches S25 and S26 are closed to connect the common-mode output of A1 to A5, and a pair of switches S27 and S28 are closed to connect the common-mode output of A2 to A5. A5's output is connected to A1's CMR input via a switch S29, and to A2's CMR input via a switch S30. Memory capacitors CM5 and CM6 are connected to the CMR inputs of A1 and A2, respectively.

In operation, error amplifier A5's input is periodically connected to the common-mode output of A1, and its output is connected to A1's CMR input. This arrangement forms a closed-loop which forces A1's common-mode output voltage, i.e., VCMR1, to be equal to VCMR, with A5's output voltage stored on CM5. Similarly, A5's input and output are periodically connected to A2's common-mode output and CMR input, respectively, to force A2's common-mode output voltage, i.e., VCMR2, to be equal to VCMR, with A5's output voltage stored on CM6. The voltages stored on the memory capacitors continuously adjust the common-mode output voltages so that VCMR1 and VCMR2 are held equal to VCMR. Keeping VCMR1= VCMR2=VCMR ensures that transients due to mismatch in the common-mode feedback circuit are largely reduced.

The operation of a ping-pong amplifier which includes the switching transient reduction circuitry described above is shown in FIG. 5b. The timing sequence is nearly identical to that shown in FIG. 2b, except for the addition of the common-mode voltage adjustments described above. In FIG. 2b, amplifier A1 is auto-zeroed during $\phi 1$ and $\phi 2$. Here, however, A1 is only auto-zeroed during $\phi 1$; during $\phi 2$, switches S25, S26 and S29 are closed to adjust A1's common-mode voltage as described above. Similarly, A2 is now auto-zeroed only during $\phi 3$; during $\phi 4$, switches S27, S28 and S30 are closed to adjust A2's common-mode voltage.

Figure 5B:
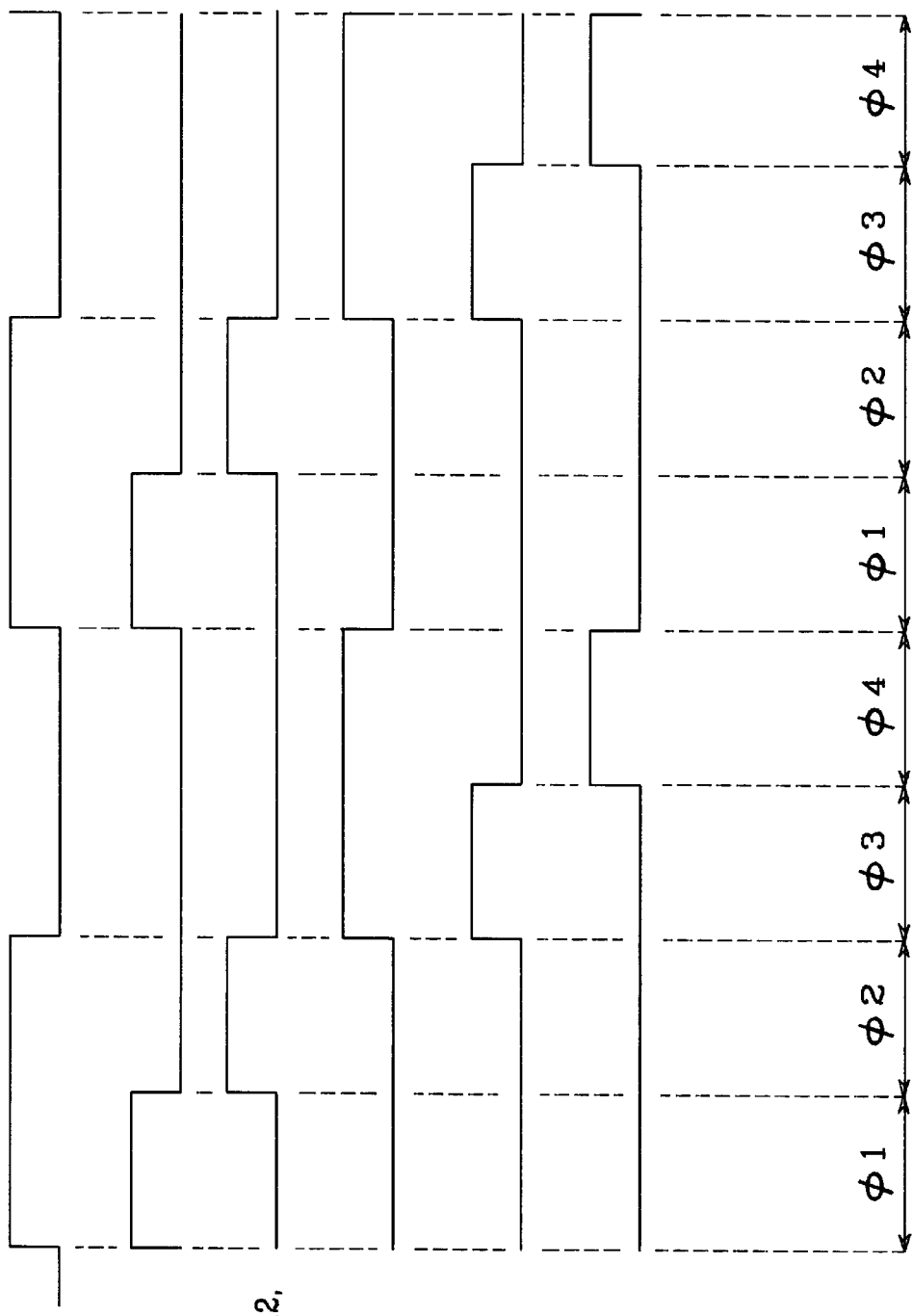

The alternative arrangements of input switches S13–S24 shown in FIGS. 3a–3g can also be applied to the circuit arrangement shown in FIG. 5a: each of these input switch arrangements is functionally equivalent to that shown in FIG. 5a, and will provide equivalent performance. The timing diagram shown in FIG. 5b is valid for all of the depicted input switch arrangements.

Figure 5C:
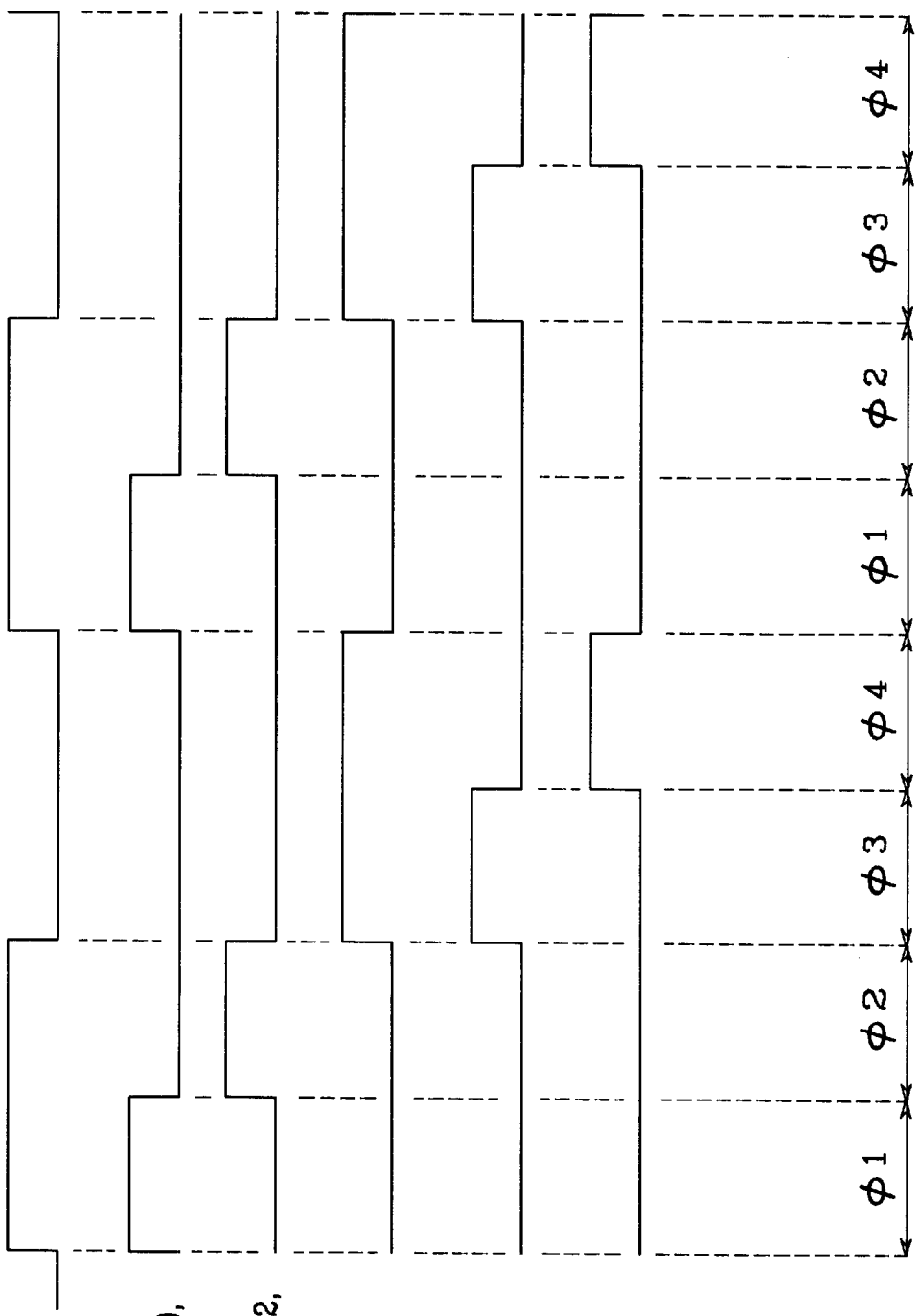
Figure 5D:
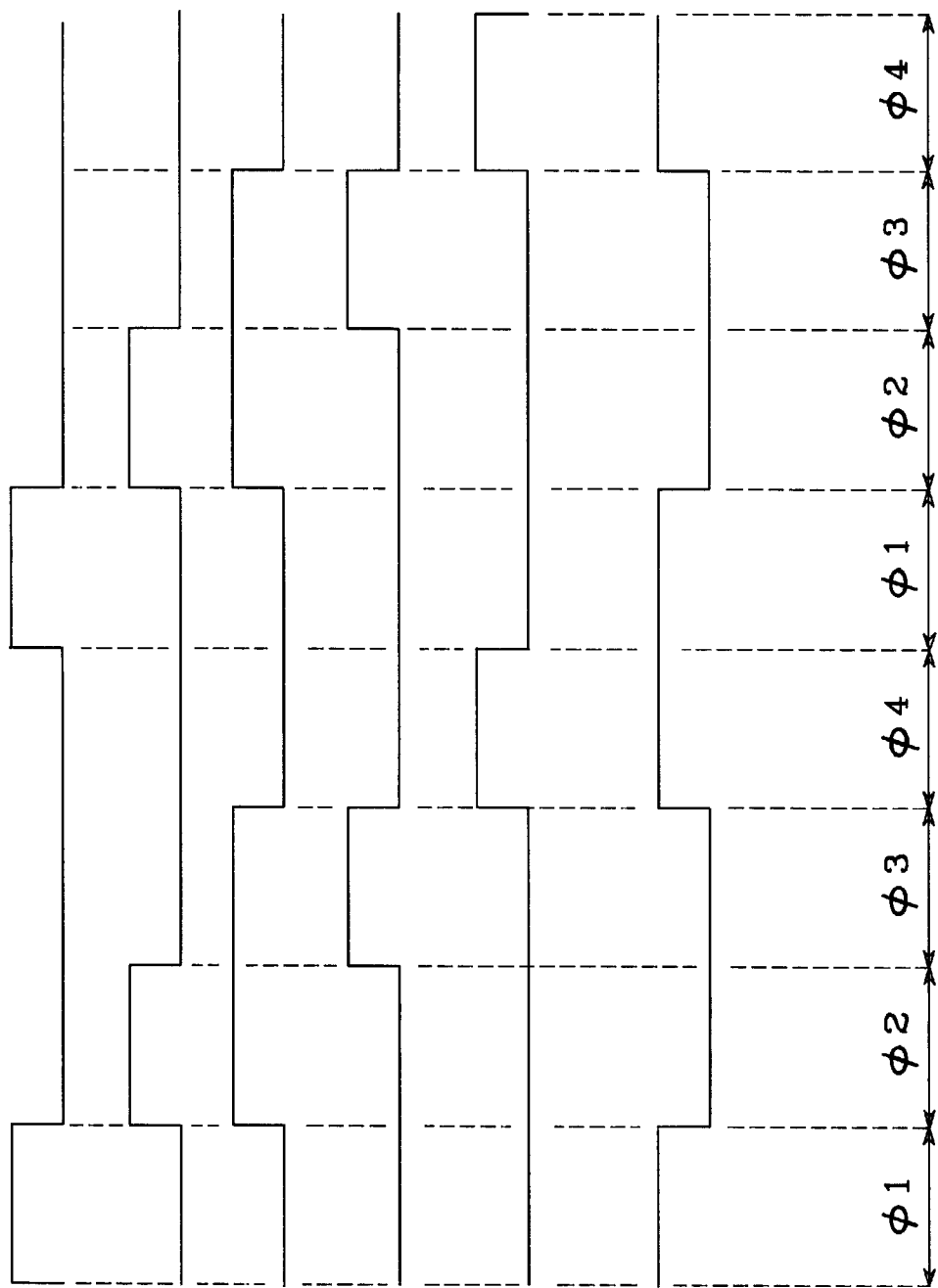

Other possible timing diagrams are shown in FIGS. 5c and 5d. Both of these timing diagrams are valid for the switch arrangements shown in FIG. 5a and FIGS. 3a–3g. These timing diagrams depict alternate sequences for the auto-zero and common-mode output adjustment steps performed for the gain amplifiers, but each sequence is functionally equivalent to that shown in FIG. 5b.

Figure 5E:
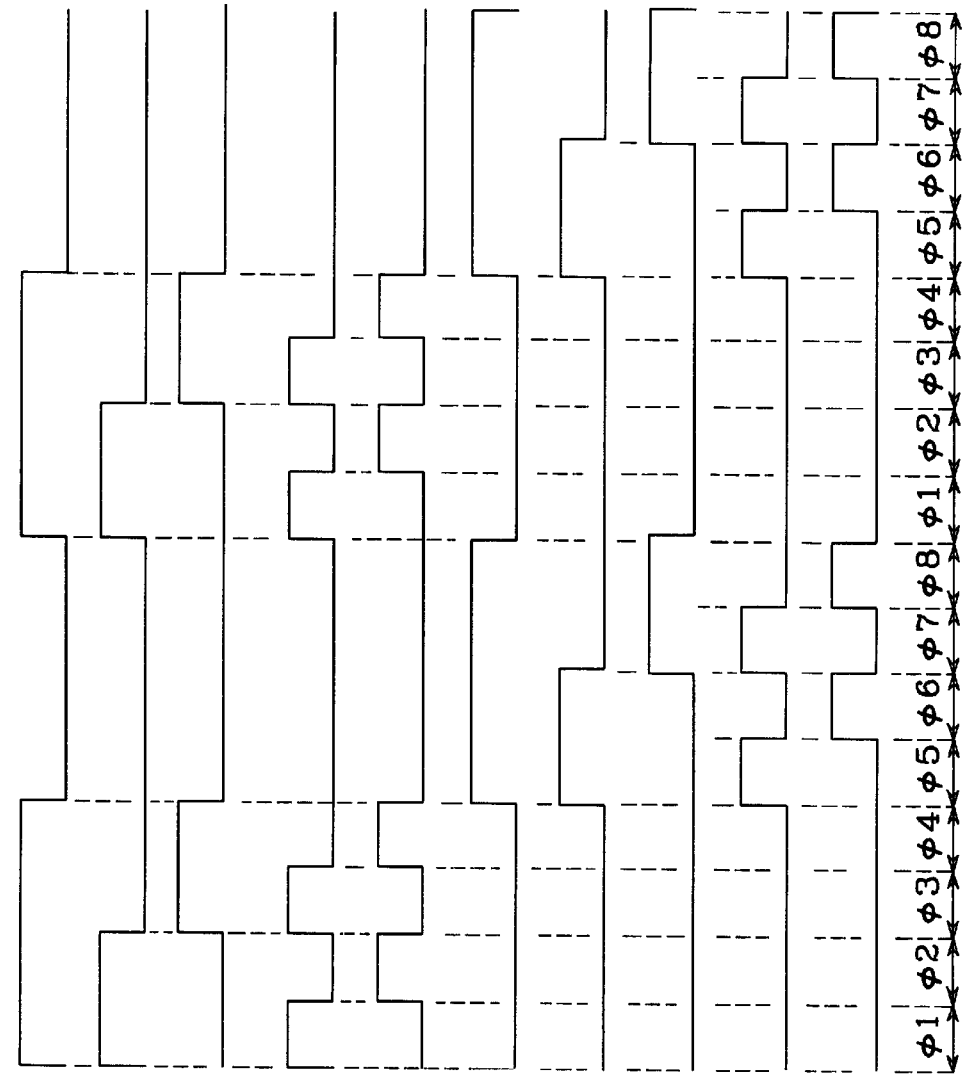

Another possible timing diagram is shown in FIG. 5e. Here, rather than perform a single chopping cycle during each auto-zero period, as in FIGS. 5b–5d, multiple chopping cycles are performed during each auto-zero period. This timing arrangement is functionally similar to that described above, and provides the same low offset and low low frequency noise benefits. Two chopping cycles per auto-zero period are illustrated in FIG. 5e; this would require the control circuit to operate the switching network in accordance with an 8-phase timing cycle.

While particular embodiments of the invention have been shown and described, numerous variations and alternate embodiments will occur to those skilled in the art. Accordingly, it is intended that the invention be limited only in terms of the appended claims.

I claim:

1. An auto-zeroed ping-pong amplifier, comprising:

first and second differential amplifiers, each of which have non-inverting and inverting differential outputs and non-inverting and inverting differential inputs, said inputs connected to receive a differential input signal comprising a positive line and a negative line, first and second nulling amplifiers, each of which has inverting and non-inverting inputs and outputs, the inverting and non-inverting outputs of said first nulling amplifier connected to the non-inverting and inverting outputs, respectively, of said first differential amplifier, and the inverting and non-inverting outputs of said second nulling amplifier connected to the non-inverting and inverting outputs, respectively, of said second differential amplifier, first and second memory capacitors connected to respective ones of said first nulling amplifier's differential inputs, third and fourth memory capacitors connected to respective ones of said second nulling amplifier's differential inputs, a switching network, and a control circuit which operates said switching network, said differential amplifiers, said control circuit, and said switching network arranged to form a ping-pong amplifier having positive and negative outputs which are alternately connected to the outputs of said first and second differential amplifiers and which provides an amplified version of said differential input signal, said control circuit and switching network arranged to periodically connect the differential outputs of said first differential amplifier to the differential inputs of said first nulling amplifier while simultaneously connecting the inputs of said first differential amplifier together to auto-zero said first differential amplifier, and to periodically connect the differential outputs of said second differential amplifier to the differential inputs of said second nulling amplifier while simultaneously connecting the inputs of said second differential amplifier together to auto-zero said second differential amplifier, said control circuit and switching network further arranged such that said input signal is amplified through said first differential amplifier and said first differential amplifier's inputs and outputs are chopped during at least a portion of the time when said first differential amplifier is not being auto-zeroed, and such that said input signal is amplified through said second differential amplifier and said second differential amplifier's inputs and outputs are chopped during at least a portion of the time when said second differential amplifier is not being auto-zeroed.

2. An auto-zeroed ping-pong amplifier, comprising:

first and second differential amplifiers, each of which have non-inverting and inverting differential outputs and non-inverting and inverting differential inputs, said inputs connected to receive a differential input signal comprising a positive line and a negative line, first and second nulling amplifiers, each of which has inverting and non-inverting inputs and outputs, the inverting and non-inverting outputs of said first nulling amplifier connected to the non-inverting and inverting outputs, respectively, of said first differential amplifier, and the inverting and non-inverting outputs of said second nulling amplifier connected to the non-inverting and inverting outputs, respectively, of said second differential amplifier, first and second memory capacitors connected to respective ones of said first nulling amplifier's differential inputs, third and fourth memory capacitors connected to respective ones of said second nulling amplifier's differential inputs, a switching network, and a control circuit which operates said switching network, said differential amplifiers, said control circuit, and said switching network arranged to form a ping-pong amplifier having positive and negative outputs which are alternately connected to the outputs of said first and second differential amplifiers and which provides an amplified version of said differential input signal, said control circuit and switching network arranged to periodically connect the differential outputs of said first differential amplifier to respective ones of the differential inputs of said first nulling amplifier while simultaneously connecting the inputs of said first differential amplifier together, thereby storing error signals on said first and second memory capacitors which are converted to respective currents by said first nulling amplifier that auto-zero said first differential amplifier, and to periodically connect the differential outputs of said second differential amplifier to respective ones of the differential inputs of said second nulling amplifier while simultaneously connecting the inputs of said second differential amplifier together, thereby storing error signals on said third and fourth memory capacitors which are converted to respective currents by said second nulling amplifier that auto-zero said second differential amplifier, said control circuit and switching network further arranged to, during one portion of the time that said first differential amplifier is not being auto-zeroed, connect the non-inverting and inverting differential inputs of said first differential amplifier to said positive and negative input lines, respectively, and the non-inverting and inverting differential outputs of said first differential amplifier to said ping-pong amplifier's positive and negative outputs, respectively, and during another portion of the time that said first differential amplifier is not being auto-zeroed, connect the non-inverting and inverting differential inputs of said first differential amplifier to said negative and positive input lines, respectively, and the non-inverting and inverting differential outputs of said first differential amplifier to said ping-pong amplifier's negative and positive outputs, respectively, such that said input signal is amplified through said first differential amplifier and said first differential amplifier's inputs and outputs are chopped, said control circuit and switching network further arranged to, during one portion of the time that said second differential amplifier is not being auto-zeroed, connect the non-inverting and inverting differential inputs of said second differential amplifier to said positive and negative input lines, respectively, and the non-inverting and inverting differential outputs of said second differential amplifier to said ping-pong amplifier's positive and negative outputs, respectively, and during another portion of the time that said second differential amplifier is not being auto-zeroed, connect the non-inverting and inverting differential inputs of said second differential amplifier to said negative and positive input lines, respectively, and the non-inverting and inverting differential outputs of said second differential amplifier to said ping-pong amplifier's negative and positive outputs, respectively, such that said input signal is amplified through said second differential amplifier and said second differential amplifier's inputs and outputs are chopped.

3. The ping-pong amplifier of claim 2, further comprising an output amplifier having a single-ended output and differential inputs which are switchably connected to respective ones of the differential outputs of said first and second differential amplifiers.

4. The ping-pong amplifier of claim 2, wherein said control circuit is arranged to operate said switching network to provide a four-phase switching cycle such that:

during a first phase, said first differential amplifier is auto-zeroed and said second differential amplifier amplifies said input signal, during a second phase, said first differential amplifier is auto-zeroed and said input signal is amplified through said second differential amplifier and said second differential amplifier's inputs and outputs are chopped, during a third phase, said second differential amplifier is auto-zeroed and said first differential amplifier amplifies said input signal, and during a fourth phase, said second differential amplifier is auto-zeroed and said input signal is amplified through said first differential amplifier and said first differential amplifier's inputs and outputs are chopped.

5. The ping-pong amplifier of claim 4, wherein said switching network comprises:

a first group of switches comprising:
a first switch connected between said positive input line and the non-inverting differential input of said first differential amplifier,
a second switch connected between said positive input line and the inverting differential input of said first differential amplifier,
third and fourth switches connected between the outputs of said first differential amplifier and respective ones of said inputs of said first nulling amplifier;

a second group of switches comprising:
a fifth switch connected between said positive input line and the non-inverting differential input of said second differential amplifier,
a sixth switch connected between said negative input line and the inverting differential input of said second differential amplifier,
seventh and eighth switches connected between the non-inverting and inverting outputs of said second differential amplifier and said ping-pong amplifier's positive and negative outputs, respectively;

a third group of switches comprising:

a ninth switch connected between said positive input line and the inverting differential input of said second differential amplifier, a tenth switch connected between said negative input line and the non-inverting differential input of said second differential amplifier, eleventh and twelfth switches connected between the non-inverting and inverting outputs of said second differential amplifier and said ping-pong amplifier's negative and positive outputs, respectively;

a fourth group of switches comprising:
  a thirteenth switch connected between said positive input line and the non-inverting differential input of said second differential amplifier,
  a fourteenth switch connected between said positive input line and the inverting differential input of said second differential amplifier,
  fifteenth and sixteenth switches connected between the outputs of said second differential amplifier and respective ones of said inputs of said second nulling amplifier;

a fifth group of switches comprising:
  a seventeenth switch connected between said positive input line and the non-inverting differential input of said first differential amplifier,
  an eighteenth switch connected between said negative input line and the inverting differential input of said first differential amplifier,
  nineteenth and twentieth switches connected between the non-inverting and inverting outputs of said first differential amplifier and said ping-pong amplifier's positive and negative outputs, respectively; and a sixth group of switches comprising:
  a twenty-first switch connected between said positive input line and the inverting differential input of said first differential amplifier,
  a twenty-second switch connected between said negative input line and the non-inverting differential input of said first differential amplifier,
  twenty-third and twenty-fourth switches connected between the non-inverting and inverting outputs of said first differential amplifier and said ping-pong amplifier's negative and positive outputs, respectively;

said control circuit arranged to control said switches such that:
  during the first phase of said cycle, the switches of said first and second groups are closed and all other switches are open,
  during the second phase of said cycle, the switches of said first and third groups are closed and all other switches are open,
  during the third phase of said cycle, the switches of said fourth and fifth groups are closed and all other switches are open, and
  during the fourth phase of said cycle, the switches of said fourth and sixth groups are closed and all other switches are open.

6. An auto-zeroed ping-pong amplifier, comprising:

first and second differential amplifiers, each of which have non-inverting and inverting differential outputs, non-inverting and inverting differential inputs, a common-mode reference voltage input (CMR), and a common-mode feedback circuit arranged to nominally set the differential amplifier's common-mode output voltage to a voltage applied to said CMR input when said amplifier's differential output voltage is zero, said differential inputs connected to receive a differential input signal comprising a positive line and a negative line, first and second nulling amplifiers, each of which has inverting and non-inverting inputs and outputs, the inverting and non-inverting outputs of said first nulling amplifier connected to the non-inverting and inverting outputs, respectively, of said first differential amplifier, and the inverting and non-inverting outputs of said second nulling amplifier connected to the non-inverting and inverting outputs, respectively, of said second differential amplifier, first and second memory capacitors connected to respective ones of said first nulling amplifier's differential inputs, third and fourth memory capacitors connected to respective ones of said second nulling amplifier's differential inputs, an error amplifier having first and second inputs and which produces an output which varies with the difference between its inputs, said first input connected to receive a predetermined common-mode reference voltage (VCMR) and said second input connected to the common-mode output of one of said first and second differential amplifiers, said error amplifier output switchably connected to one of said CMR inputs, fifth and sixth memory capacitors connected to the CMR inputs of said first and second differential amplifiers, respectively, a switching network, and a control circuit which operates said switching network, said differential amplifiers, said control circuit, and said switching network arranged to form a ping-pong amplifier having positive and negative outputs which are alternately connected to the outputs of said first and second differential amplifiers and which provides an amplified version of said differential input signal, said control circuit and switching network arranged to periodically connect the differential outputs of said first differential amplifier to the differential inputs of said first nulling amplifier while simultaneously connecting the inputs of said first differential amplifier together to auto-zero said first differential amplifier, and to periodically connect the differential outputs of said second differential amplifier to the differential inputs of said second nulling amplifier while simultaneously connecting the inputs of said second differential amplifier together to auto-zero said second differential amplifier, said control circuit and switching network further arranged such that said input signal is amplified through said first differential amplifier and said first differential amplifier's inputs and outputs are chopped during at least a portion of the time when said first differential amplifier is not being auto-zeroed, and such that said input signal is amplified through said second differential amplifier and said second differential amplifier's inputs and outputs are chopped during at least a portion of the time when said second differential amplifier is not being auto-zeroed, said control circuit and switching network further arranged such that, periodically, the common-mode output of said first differential amplifier is connected to said error amplifier's second input and said error amplifier's output is connected to said first differential amplifier's CMR input such that a closed-loop is formed which forces said first differential amplifier's common-mode output voltage to be equal to VCMR and said error amplifier's output voltage stored on said fifth memory capacitor, and said control circuit and switching network further arranged such that, periodically, the common-mode output of said second differential amplifier is connected to said error amplifier's second input and said error amplifier's output is connected to said second differential amplifier's CMR input such that a closed-loop is formed which forces said second differential amplifier's common-mode output voltage to be equal to VCMR and said error amplifier's output voltage stored on said sixth memory capacitor.

7. The ping-pong amplifier of claim 6, further comprising an output amplifier having a single-ended output and differential inputs which are switchably connected to respective ones of the differential outputs of said first and second differential amplifiers.

8. The ping-pong amplifier of claim 6, wherein said control circuit is arranged to operate said switching network to provide a four-phase switching cycle such that:

during a first phase, said first differential amplifier is auto-zeroed and said second differential amplifier amplifies said input signal, during a second phase, the common-mode output voltage of said first amplifier is forced to be equal to VCMR and said input signal is amplified through said second differential amplifier and said second differential amplifier's inputs and outputs are chopped, during a third phase, said second differential amplifier is auto-zeroed and said first differential amplifier amplifies said input signal, and during a fourth phase, the common-mode output voltage of said second amplifier is forced to be equal to VCMR and said input signal is amplified through said first differential amplifier and said first differential amplifier's inputs and outputs are chopped.

9. The ping-pong amplifier of claim 8, wherein said switching network comprises:

a first group of switches comprising:
  a first switch connected between said positive input line and the non-inverting differential input of said first differential amplifier, and
  a second switch connected between said positive input line and the inverting differential input of said first differential amplifier;

a second group of switches comprising:
  third and fourth switches connected between the outputs of said first differential amplifier and respective ones of said inputs of said first nulling amplifier,
  a fifth switch connected between said positive input line and the non-inverting differential input of said second differential amplifier,
  a sixth switch connected between said negative input line and the inverting differential input of said second differential amplifier, and
  seventh and eighth switches connected between the non-inverting and inverting outputs of said second differential amplifier and said ping-pong amplifier's positive and negative outputs, respectively;

a third group of switches comprising:
  a ninth switch connected between said positive input line and the inverting differential input of said second differential amplifier,
  a tenth switch connected between said negative input line and the non-inverting differential input of said second differential amplifier,
  eleventh and twelfth switches connected between the non-inverting and inverting outputs of said second differential amplifier and said ping-pong amplifier's negative and positive outputs, respectively,
  thirteenth and fourteenth switches connected between the outputs of said first differential amplifier and said error amplifier's second input, and
  a fifteenth switch connected between the output of said error amplifier and said first differential amplifier's CMR input;

a fourth group of switches comprising:
  a sixteenth switch connected between said positive input line and the non-inverting differential input of said second differential amplifier, and
  a seventeenth switch connected between said positive input line and the inverting differential input of said second differential amplifier;

a fifth group of switches comprising:
  eighteenth and nineteenth switches connected between the outputs of said second differential amplifier and respective ones of said inputs of said second nulling amplifier,
  a twentieth switch connected between said positive input line and the non-inverting differential input of said first differential amplifier,
  a twenty-first switch connected between said negative input line and the inverting differential input of said first differential amplifier,
  twenty-second and twenty-third switches connected between the non-inverting and inverting outputs of said first differential amplifier and said ping-pong amplifier's positive and negative outputs, respectively; and a sixth group of switches comprising:
  a twenty-fourth switch connected between said positive input line and the inverting differential input of said first differential amplifier,
  a twenty-fifth switch connected between said negative input line and the non-inverting differential input of said first differential amplifier,
  twenty-sixth and twenty-seventh switches connected between the non-inverting and inverting outputs of said first differential amplifier and said ping-pong amplifier's negative and positive outputs, respectively,
  twenty-eighth and twenty-ninth switches connected between the outputs of said second differential amplifier and said error amplifier's second input, and
  a thirtieth switch connected between the output of said error amplifier and said second differential amplifier's CMR input;

said control circuit arranged to control said switches such that:
  during the first phase of said cycle, the switches of said first and second groups are closed and all other switches are open,
  during the second phase of said cycle, the switches of said first and third groups are closed and all other switches are open,
  during the third phase of said cycle, the switches of said fourth and fifth groups are closed and all other switches are open, and
  during the fourth phase of said cycle, the switches of said fourth and sixth groups are closed and all other switches are open.

10. A method of reducing low frequency noise and offset voltage in a ping-pong amplifier which comprises first and second differential amplifiers arranged in a ping-pong amplifier configuration, each of said first and second amplifiers having differential inputs and outputs, comprising:

auto-zeroing said first differential amplifier while amplifying an input signal applied to the differential inputs of said second differential amplifier with said second differential amplifier, chopping second differential amplifier's inputs and outputs while said second differential amplifier amplifies said input signal, auto-zeroing said second differential amplifier while amplifying an input signal applied to the differential inputs of said first differential amplifier with said first differential amplifier, and chopping said first differential amplifier's inputs and outputs while said first differential amplifier amplifies said input signal.

11. The method of claim 10, wherein each of said first and second differential amplifiers includes a common-mode reference voltage input (CMR) and is arranged such that its common-mode output voltage varies with a voltage applied to its CMR input, further comprising:

determining a desired common-mode output voltage (VCMR) for said first and second differential amplifiers when their respective differential output voltages are zero, periodically determining a first correction voltage which, when applied to said first differential amplifier's CMR input, forces said first differential amplifier's common-mode output voltage to be equal to VCMR, continuously applying said first correction voltage to said first differential amplifier's CMR input, periodically determining a second correction voltage which, when applied to said second differential amplifier's CMR input, forces said second differential amplifier's common-mode output voltage to be equal to VCMR, and continuously applying said second correction voltage to said second differential amplifier's CMR input.

12. The method of claim 11, wherein determining said first correction voltage comprises amplifying the difference between the common-mode output voltage of said first differential amplifier and VCMR, said amplified difference being equal to said first correction voltage, and determining said second correction voltage comprises amplifying the difference between the common-mode output voltage of said second differential amplifier and VCMR, said amplified difference being equal to said second correction voltage.

13. The method of claim 11, further comprising storing said first and second correction voltages in first and second storage devices connected to the CMR inputs of said first and second differential amplifiers, respectively.

14. The method of claim 10, further comprising an output amplifier having a single-ended output and differential inputs which are switchably connected to respective ones of the differential outputs of said first and second differential amplifiers.

15. A method of reducing low frequency noise and offset voltage in a ping-pong amplifier which comprises first and second differential amplifiers arranged in a ping-pong amplifier configuration, each of said first and second amplifiers having differential inputs and outputs and a common-mode reference voltage input (CMR) and is arranged such that its common-mode output voltage varies with a voltage applied to its CMR input, comprising:

determining a desired common-mode output voltage (VCMR) for said first and second differential amplifiers when their respective differential output voltages are zero, auto-zeroing said first differential amplifier while amplifying an input signal applied to the differential inputs of said second differential amplifier with said second differential amplifier, chopping said second differential amplifier's inputs and outputs while said second differential amplifier amplifies said input signal, auto-zeroing said second differential amplifier while amplifying an input signal applied to the differential inputs of said first differential amplifier with said first differential amplifier, chopping said first differential amplifier's inputs and outputs while said first differential amplifier amplifies said input signal, periodically determining a first correction voltage which, when applied to said first differential amplifier's CMR input, forces said first differential amplifier's common-mode output voltage to be equal to VCMR, continuously applying said first correction voltage to said first differential amplifier's CMR input, periodically determining a second correction voltage which, when applied to said second differential amplifier's CMR input, forces said second differential amplifier's common-mode output voltage to be equal to VCMR, and continuously applying said second correction voltage to said second differential amplifier's CMR input.

16. The method of claim 15, further comprising an output amplifier having a single-ended output and differential inputs which are switchably connected to respective ones of the differential outputs of said first and second differential amplifiers.

* * * * *